(12) United States Patent
Verdugo Muñoz et al.

(10) Patent No.: US 11,729,899 B2
(45) Date of Patent: Aug. 15, 2023

(54) METHOD FOR SHIELDING A PRINTED CIRCUIT BOARD FROM ELECTROMAGNETIC INTERFERENCE AND NOISE DURING TESTING

(71) Applicant: Skyworks Solutions, Inc., Irvine, CA (US)

(72) Inventors: Cesar Verdugo Muñoz, Thousand Oaks, CA (US); Jorge Luis Pineda, Aliso Viejo, CA (US); Edgar Antonio Martinez, Mexicali (MX); Daniel Murillo, Mexicali (MX); Adrian Flores Baca, Simi Valley, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 283 days.

(21) Appl. No.: 17/137,968

(22) Filed: Dec. 30, 2020

(65) Prior Publication Data

US 2021/0120666 A1 Apr. 22, 2021

Related U.S. Application Data

(63) Continuation of application No. 16/838,437, filed on Apr. 2, 2020, now Pat. No. 11,051,397.

(60) Provisional application No. 62/833,064, filed on Apr. 12, 2019, provisional application No. 62/833,125, filed on Apr. 12, 2019.

(51) Int. Cl.
| | |
|---|---|
| *H05K 1/02* | (2006.01) |
| *H05K 3/34* | (2006.01) |
| *H05K 9/00* | (2006.01) |
| *G01R 1/18* | (2006.01) |

(52) U.S. Cl.
CPC ............ *H05K 1/0225* (2013.01); *G01R 1/18* (2013.01); *H05K 3/34* (2013.01); *H05K 3/3447* (2013.01); *H05K 9/0069* (2013.01); *H05K 2203/1147* (2013.01); *Y10T 29/49002* (2015.01); *Y10T 29/49117* (2015.01)

(58) Field of Classification Search
CPC ............ H05K 1/0225; H05K 1/0268; H05K 2201/10371; H05K 2203/1509; H05K 3/34; H05K 5/061; H05K 9/0022; H05K 9/0069; G01M 13/045; Y10T 29/49002
USPC ....... 29/592.1, 428, 825, 829, 830, 832, 846
See application file for complete search history.

(56) References Cited

U.S. PATENT DOCUMENTS

| | | | |
|---|---|---|---|
| 6,239,359 B1 | 5/2001 | Lilienthal, II | |
| 6,608,251 B1 | 8/2003 | Nurmi | |
| 9,516,795 B2 * | 12/2016 | Moore, Jr. | ............... H05K 7/20 |
| 10,108,234 B1 * | 10/2018 | Hou | ........................... G06F 1/20 |
| 2007/0247179 A1 | 10/2007 | Kingston | |
| 2018/0310440 A1 | 10/2018 | Hunt | |
| 2019/0045674 A1 | 2/2019 | Liang | |

* cited by examiner

*Primary Examiner* — Thiem D Phan
(74) *Attorney, Agent, or Firm* — Knobbe, Martens, Olson & Bear LLP

(57) ABSTRACT

A shield enclosure includes a housing with a peripheral wall that defines a cavity, and a cover removably coupleable to the housing to at least partially seal the cavity. The cavity is sized to receive a printed circuit board therein. The housing shields the printed circuit board from electromagnetic interference and noise during noise figure testing of a radiofrequency component on the printed circuit board.

10 Claims, 12 Drawing Sheets

METHOD FOR SHIELDING A PRINTED CIRCUIT BOARD FROM ELECTROMAGNETIC INTERFERENCE AND NOISE DURING TESTING

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the invention relate to a test fixture, and in particular, to a test fixture for shielding a printed circuit board against electromagnetic interference and noise during testing.

Description of the Related Art

The manufacture of radiofrequency (RF) components (e.g., RF circuits) includes testing, such as noise figure testing for reliability. However, interference (e.g., electromagnetic interference, noise, etc.) during testing can result in inaccurate measurements, leading to lower manufacturing yields. Such interference can be from environmental sources, such as cellular signals, or test equipment.

SUMMARY

There is a need for an improved system and method for shielding printed circuit boards (PCBs) from interference (e.g., electromagnetic interference, noise) during testing of RF components attached to the PCBs.

In accordance with one aspect of the disclosure, a fixture (e.g., shield enclosure module) is provided into which the PCB can be placed during testing. The fixture can enclose the PCB and shield the PCB (and any RF component attached to it) from interference (e.g., electromagnetic interference, noise) during testing. Optionally, the fixture can shield the PCB to reduce the level of radiofrequency (RF) signals absorbed by the PCB by at least 40 dB.

In accordance with another aspect of the disclosure, a method for shielding a PCB and RF component(s) attached to it during testing (e.g., noise figure testing) is provided that reduces the level of radiofrequency (RF) signals absorbed by the PCB by at least 40 dB.

In accordance with one aspect of the disclosure, an enclosure for shielding a printed circuit board against electromagnetic interference and noise during noise figure testing is provided. The enclosure comprises a housing having a cavity defined by and between a peripheral wall of the housing, the cavity configured to receive a printed circuit board therein, at least a portion of the peripheral wall configured to couple with one or more radiofrequency connectors so that a pin of each radiofrequency connector contacts an electrical contact on the printed circuit board. The enclosure also comprises a cover configured to removably couple to the housing over the cavity to at least partially seal the cavity.

In accordance with another aspect of the disclosure, an enclosure system for shielding printed circuit boards against electromagnetic interference and noise during noise figure testing. The enclosure system comprises a test fixture and one or more enclosures removably coupleable to the test fixture. Each test fixture comprises a housing having a cavity defined by and between a peripheral wall of the housing, the cavity configured to receive the printed circuit board therein, at least a portion of the peripheral wall configured to couple with one or more radiofrequency connectors so that a pin of each radiofrequency connector contacts an electrical contact on the printed circuit board, and a cover configured to removably couple to the housing over the cavity to at least partially seal the cavity.

In accordance with one aspect of the disclosure, a method for shielding a printed circuit board from electromagnetic interference and noise during noise figure testing is provided. The method comprises inserting a printed circuit board into a cavity of a housing defined by a peripheral wall of the housing, attaching one or more radiofrequency connectors to the peripheral wall so that a pin of each radiofrequency connectors substantially aligns with an electrical contact on the printed circuit board, soldering the pin of the one or more radiofrequency connector to its corresponding electrical contact on the printed circuit board, and mounting a cover to the housing over the cavity to at least partially seal the cavity.

In accordance with another aspect of the disclosure, a method for shielding a printed circuit board from electromagnetic interference and noise during noise figure testing is provided. The method comprises removing a cover from a housing to expose a printed circuit board in a cavity defined by a peripheral wall, removing soldering between electrical contacts on the printed circuit board and one or more pins of one or more radiofrequency connectors attached to the peripheral wall, detaching the one or more radiofrequency connectors from the peripheral wall, and removing the printed circuit board and inserting a replacement printed circuit board.

DETAILED DESCRIPTION

Figure 1:
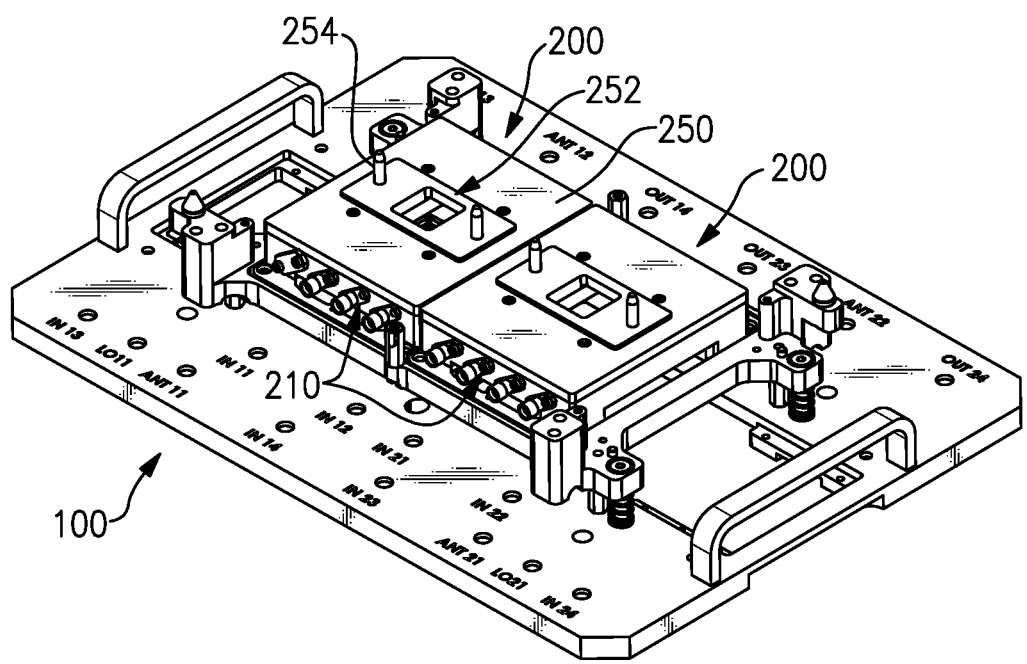
FIG. 1 is a schematic perspective view of a test fixture with a pair of shield enclosures mounted side by side on the test fixture.
Figure 2:
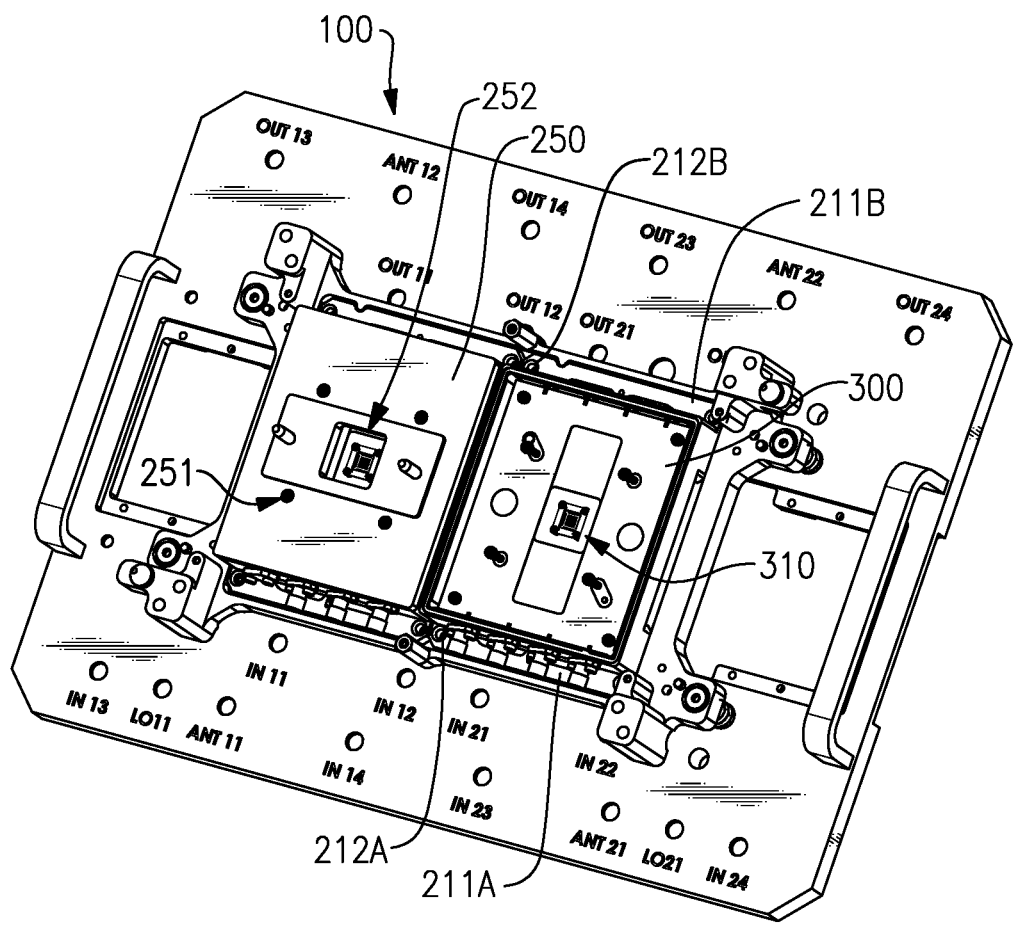
FIG. 2 is a schematic perspective view of the test fixture of FIG. 1, with a cover removed from one of the shield enclosures.
Figure 3:
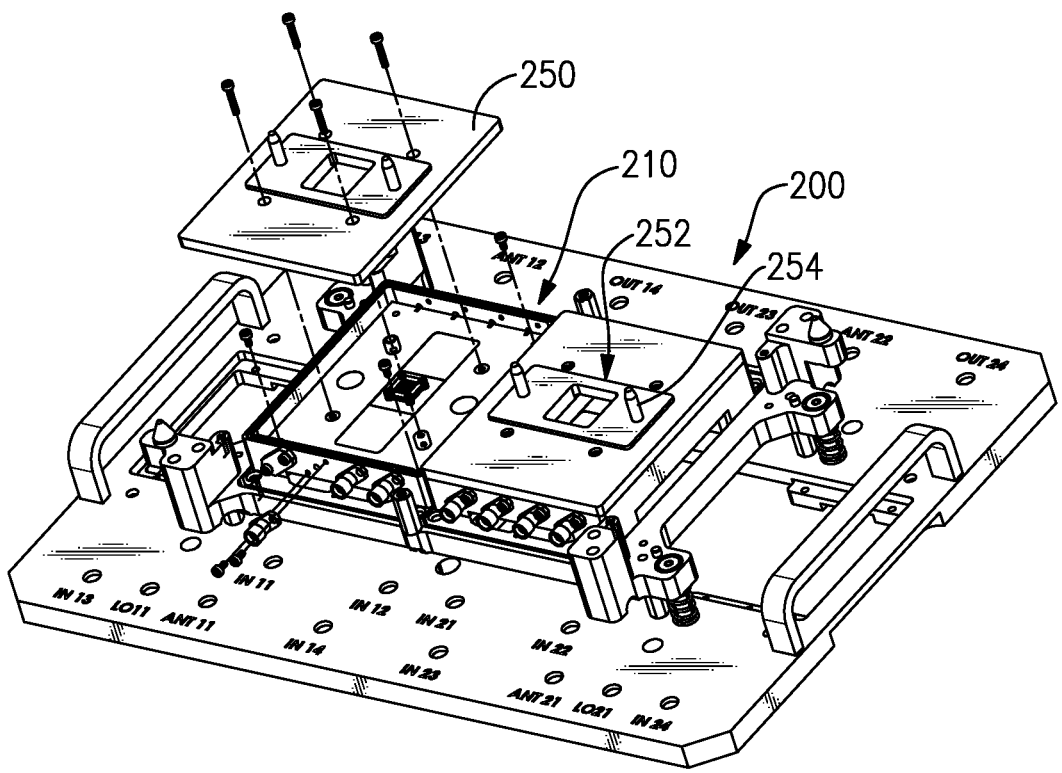
FIG. 3 is a schematic perspective view of the test fixture of FIG. 1, with components of one of the shield enclosures shown in exploded view.

FIGS. 1-4 shows a test fixture 100, that can be attached to an automatic test equipment (ATE) machine (not shown). The test fixture 100 can have one or more shield enclosures 200 mounted thereon. Though FIG. 1 shows a pair of shield enclosures 200 mounted on the test fixture 100, one of skill in the art will recognize that the test fixture 100 can include more or fewer shield enclosures 200.

Each shield enclosure 200 has a housing 210 and a cover 250 that removably covers the housing 210, the housing 210 sized to receive a printed circuit board (PCB) 300 therein. In one implementation, the shield enclosure 200 can be made of aluminum. However, in other implementations, the shield enclosure 200 can be made of other suitable materials (e.g., other suitable metals). In one implementation the shield enclosure 200 (e.g., generally all surfaces of the housing 210 and cover 250) can be coated with a chromate coating (e.g., a clear coating). Advantageously, the coating can protect the enclosure 200 from oxidation and/or facilitate grounding of the printed circuit board 300 placed in the housing 210.

Figure 4:
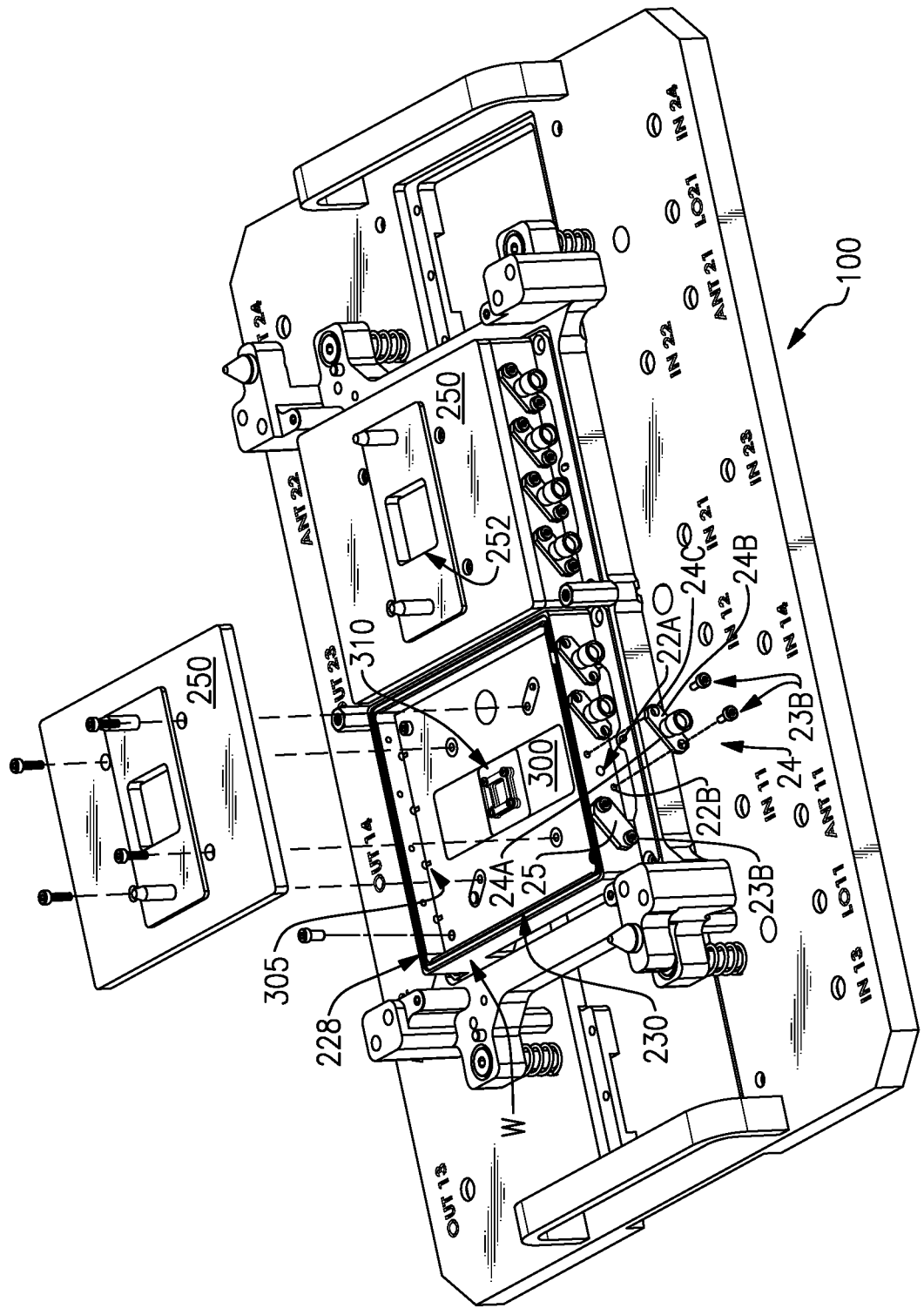
FIG. 4 is an enlarged partial view of one of the shield enclosures shown in exploded view.
Figure 6:
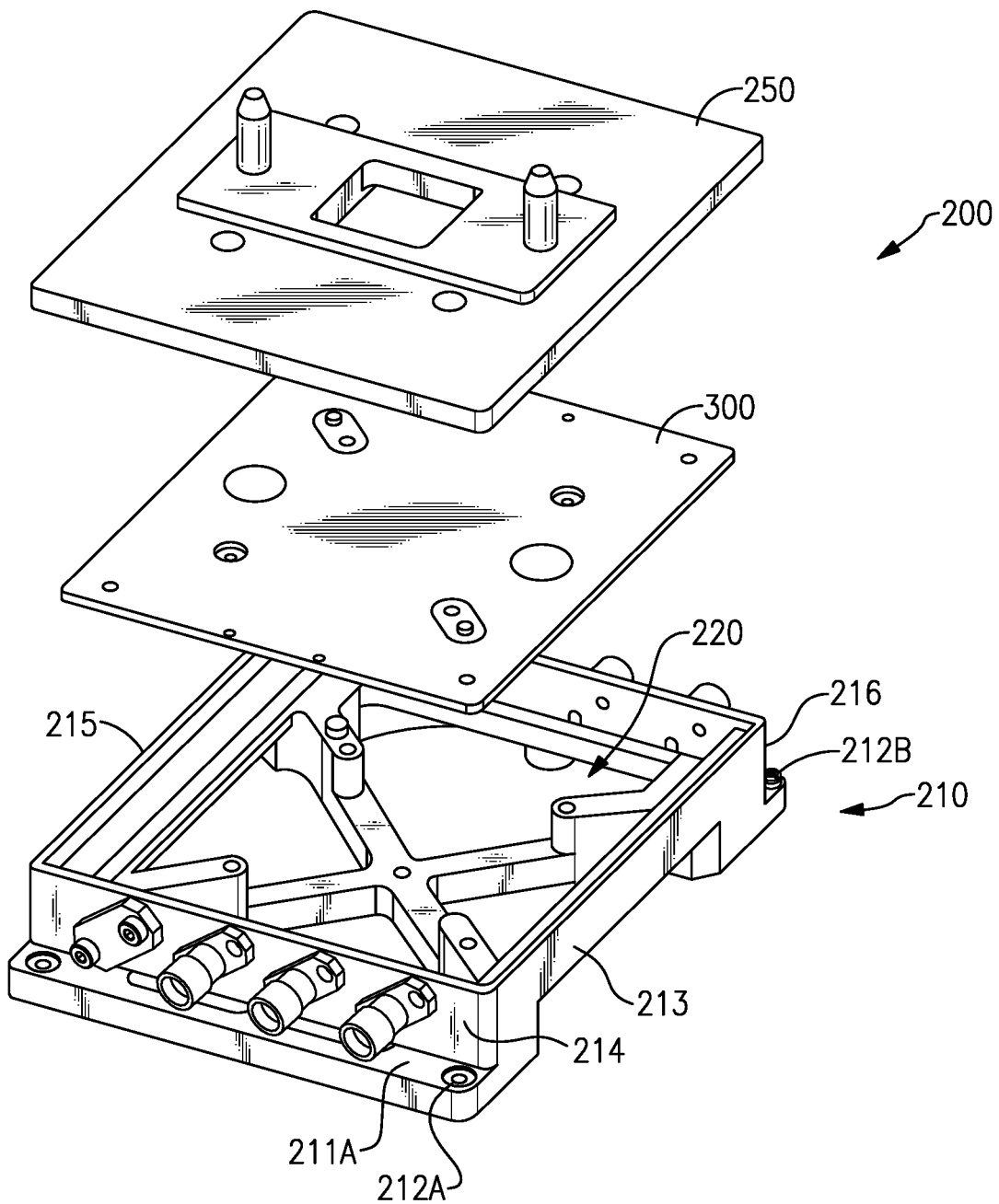
FIG. 6 is a schematic exploded view of a shield enclosure.
Figure 7A:
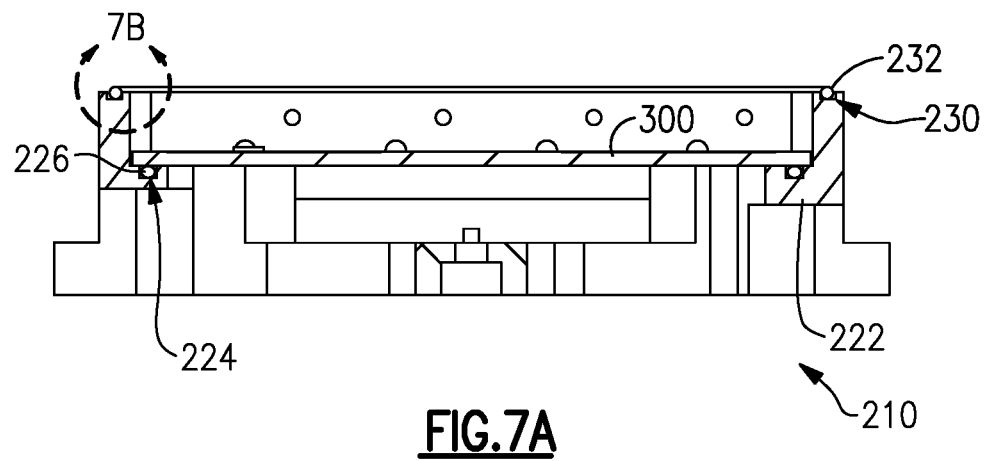
FIG. 7A is a cross-sectional view of a housing of the shield enclosure in FIG. 6
Figure 7B:
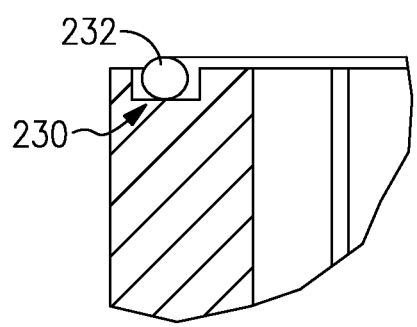
FIG. 7B is an enlarged partial cross-sectional view of the housing of the shield enclosure of FIG. 6.

In one implementation, the housing 210 can have a generally rectangular shape (e.g., a square shape). With reference to FIGS. 4 and 6, the housing 210 is at least partially defined by a first pair of spaced apart walls 213, 215 and a second pair of spaced apart walls 214, 216 that extend generally perpendicular to the first pair of spaced apart walls 213, 215. The walls 213, 214, 215, 216 can define a peripheral wall W of the housing 210. The peripheral wall W can define an opening or cavity 220 (e.g., a rectangular shaped, such as square, opening or cavity) between the walls 213, 214, 215, 216. The opening 220 can be sized to receive the printed circuit board 300 therein. In one optional implementation, the size and shape of the opening 220 can generally coincide with the size and shape of the printed circuit board 300 (e.g. to inhibit play or significant movement between the printed circuit board 300 and the housing 210).

With continued reference to FIGS. 4 and 6, in one implementation, the first pair of spaced apart walls 213, 215 can each optionally be continuous solid walls (e.g., without any holes or apertures formed in the walls). In one implementation, the second pair of spaced apart walls 214, 216 can each optionally have a one or more (e.g., a plurality of) holes or apertures 22 formed therein. The one or more holes or apertures 22 can include one or more central holes or apertures 22A and one or more mounting holes or aperture 22B disposed about the central hole(s) 22A. Optionally, the central hole(s) 22A can be larger than the mounting hole(s) 22B. The central hole(s) or aperture(s) 22A can be sized to at least partially receive a radiofrequency (RF) connector 24, such as a pin 24A of the RF connector 24 (e.g., in a press-fit manner). The RF connector 24 can couple to a coaxial cable (not shown). In one implementation, the RF connector 24 is an SMA (SubMiniature version A) connector 24. In one implementation, the RF connector 24 is a flange mount SMA connector 24 with a flange 24B that has holes 24C that align with the holes or apertures 22B on the walls 214, 216 when the RF connector 24 is coupled to the housing 210, so that the flange 24B is mounted adjacent the walls 214, 216 by the fasteners (e.g., screws, bolts) 23B that can extend through the holes 23C in the flange 24B and at least partially extend into the mounting holes or apertures 22B in the walls 214, 216. Central hole(s) 22A that are not used to couple an RF connector 24 can be closed off with a plate 25 that is attached to the walls 214, 216 with fasteners 23B, as shown in FIG. 4.

With reference to FIGS. 5-7B, the housing 210 can have an inner lower rim or shoulder 222 that can support the PCB 300 when the PCB 300 is inserted into the opening 220 of the housing 210. A groove 224 can be defined in the inner lower rim 222. Optionally, the groove 224 can extend along the length of the inner lower rim 222 (e.g., can extend circumferentially within the housing 210 proximate an inner surface of the walls 213, 214, 215, 216). Optionally, the groove 224 can be sized to at least partially receive and/or retain a gasket 226, such as an electromagnetic interference (EMI) shielding gasket. Optionally, the gasket 226 can be made of an elastomer material (e.g., an electromagnetic isolator elastomer material). One suitable EMI shielding gasket is manufactured by Parker Chomerics. However, the gasket 226 can be made of other suitable materials. With continued reference to FIGS. 5-7B, the walls 213, 214, 215, 216 can have an upper rim 228. A groove 230 can be defined in the upper rim 228. Optionally, the groove 230 can extend along the length of the upper rim 228 (e.g., can extend circumferentially along the walls 213, 214, 215, 216). Optionally, the groove 230 can be sized to at least partially receive and/or retain a gasket 232, such as an electromagnetic interference (EMI) shielding gasket. Optionally, the gasket 232 can be made of an elastomer material. However, the gasket 232 can be made of other suitable materials. Advantageously, the gaskets 226, 232 can completely shield the top and bottom of the PCB 300.

Figure 5:
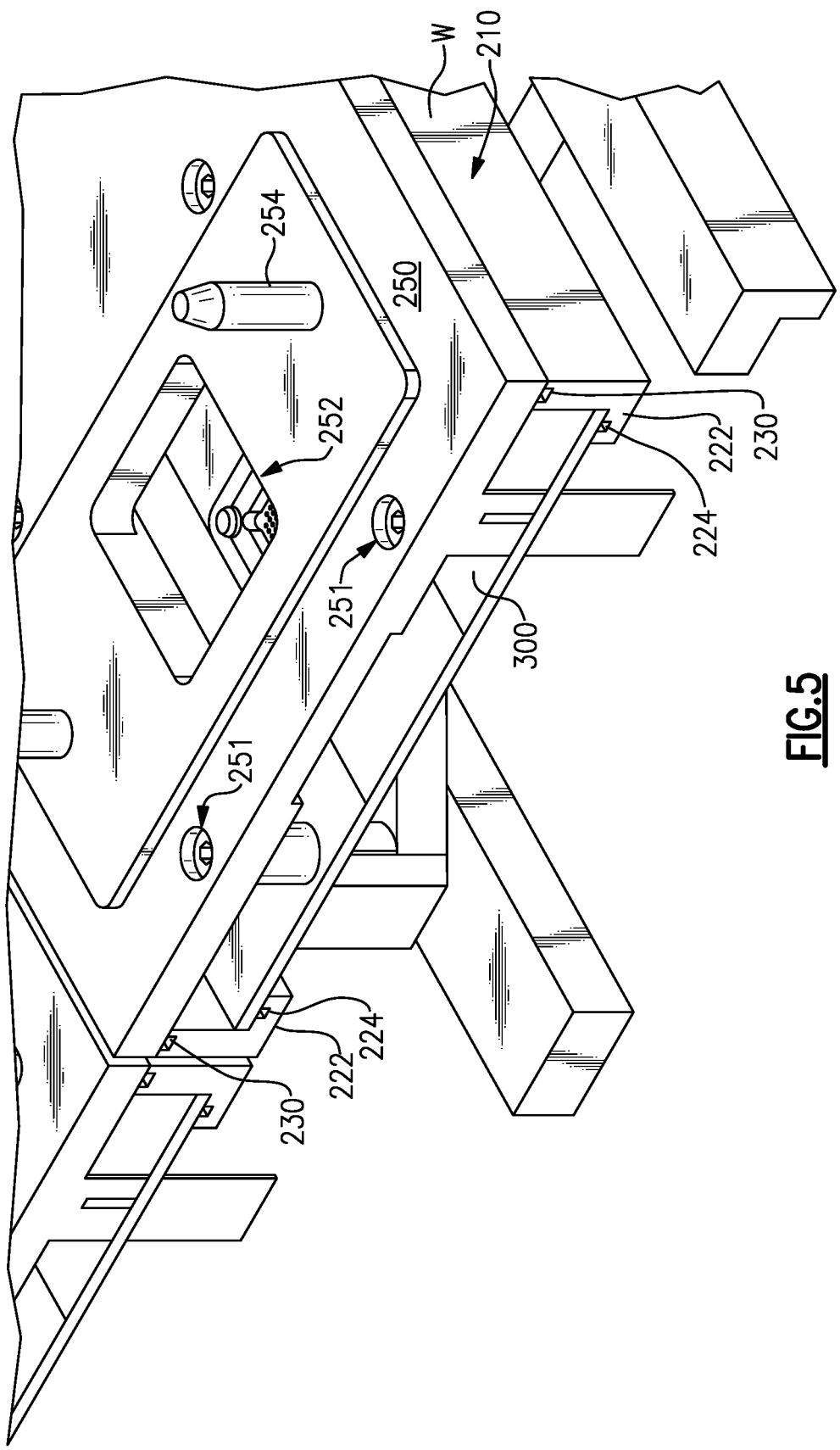
FIG. 5 is a schematic partial cross-sectional view of a shield enclosure.

The cover 250 can be removably attached to the housing 210 with one or more fasteners 251 over the opening 220 of the housing 210 so that the cover 250 contacts one or both of the upper rim 228 and the gasket 232. The cover 250 can have an opening 252 through which the PCB 300 can be accessed, as discussed further below. Optionally, the opening 252 can have a length and width of 20 mm by 20 mm. However, the opening 252 can have other suitable dimensions. The cover 250 can be attached to the housing with one or more fasteners (e.g., screws, bolts), as shown in FIG. 5.

Optionally, the housing 210 can have a pair of flanges 211A, 211B that extend generally perpendicular to the walls 213, 214, 215, 216 and have one or more openings 212A, 212B. The opening(s) 212A, 212B can receive a fastener (e.g., screw, bolt) therethrough to couple the housing 210 to the test fixture 100.

With reference to FIGS. 2-5, the PCB 300 can have a socket 310 to which a part (e.g., an integrated circuit module) can be coupled. Optionally, the part can be inserted into the socket 310 via the opening 252 in the cover 250.

Figure 8:
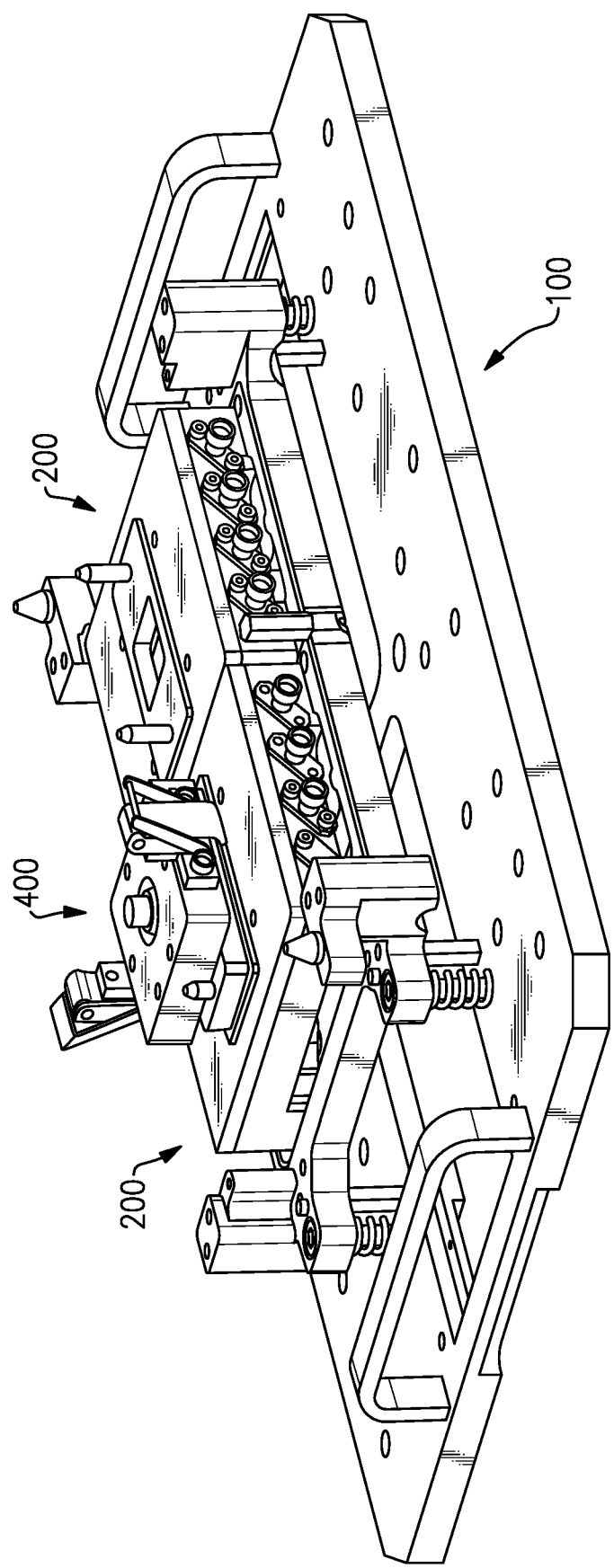
FIG. 8 is a schematic perspective view of the test fixture of FIG. 1 with a handler workpress installed over one of the enclosure modules during a test procedure.
Figure 9:
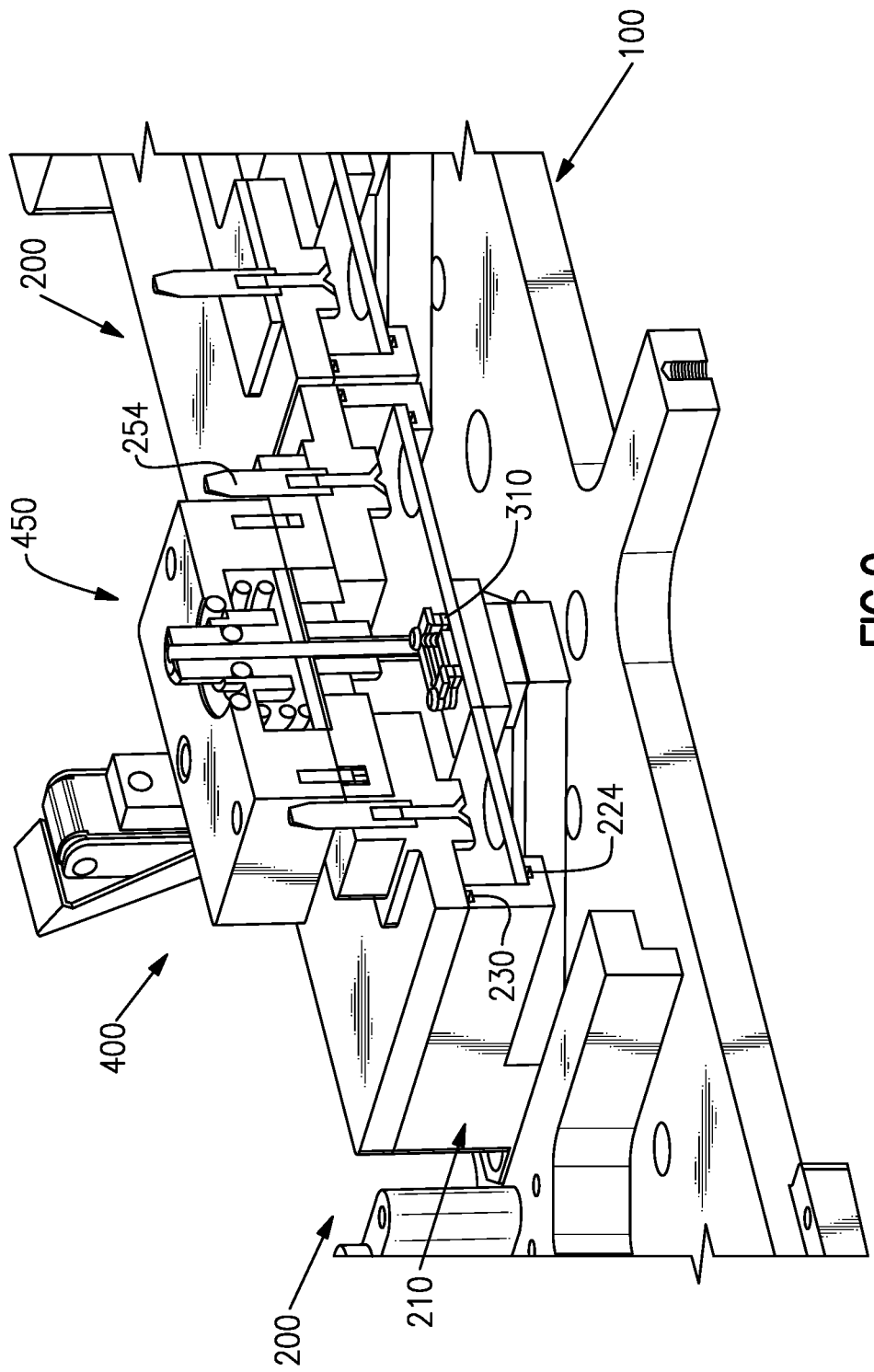
FIG. 9 is a schematic perspective partial cross-sectional view of the handler workpress of FIG. 8 installed over one of the enclosure modules during a test procedure.

With reference to FIGS. 8-9, the shield enclosures 200 are mounted side by side on the test fixture 100. The shield enclosures 200 independently shield the PCBs 300 in each enclosure 200 from each other, advantageously allowing for simultaneous testing of parts (e.g., integrated circuit modules) in adjacent shield enclosures 200 without interference from each other or the environment, which can increase output or yield of tested parts. A workpress assembly 400 can be coupled to the cover 250 so that a tool 450 extends through the opening 252 of the cover 250 and the workpress assembly completely seals the cover 250 to thereby completely shield the PCB 300 inside the shield enclosure 200 during subsequent testing of a part (e.g., RF component, RF circuit) on the PCB 300. The workpress assembly 400 can optionally be coupled to the cover 250 between a pair of guideposts 254 that protrude from the cover 250.

Figure 10:
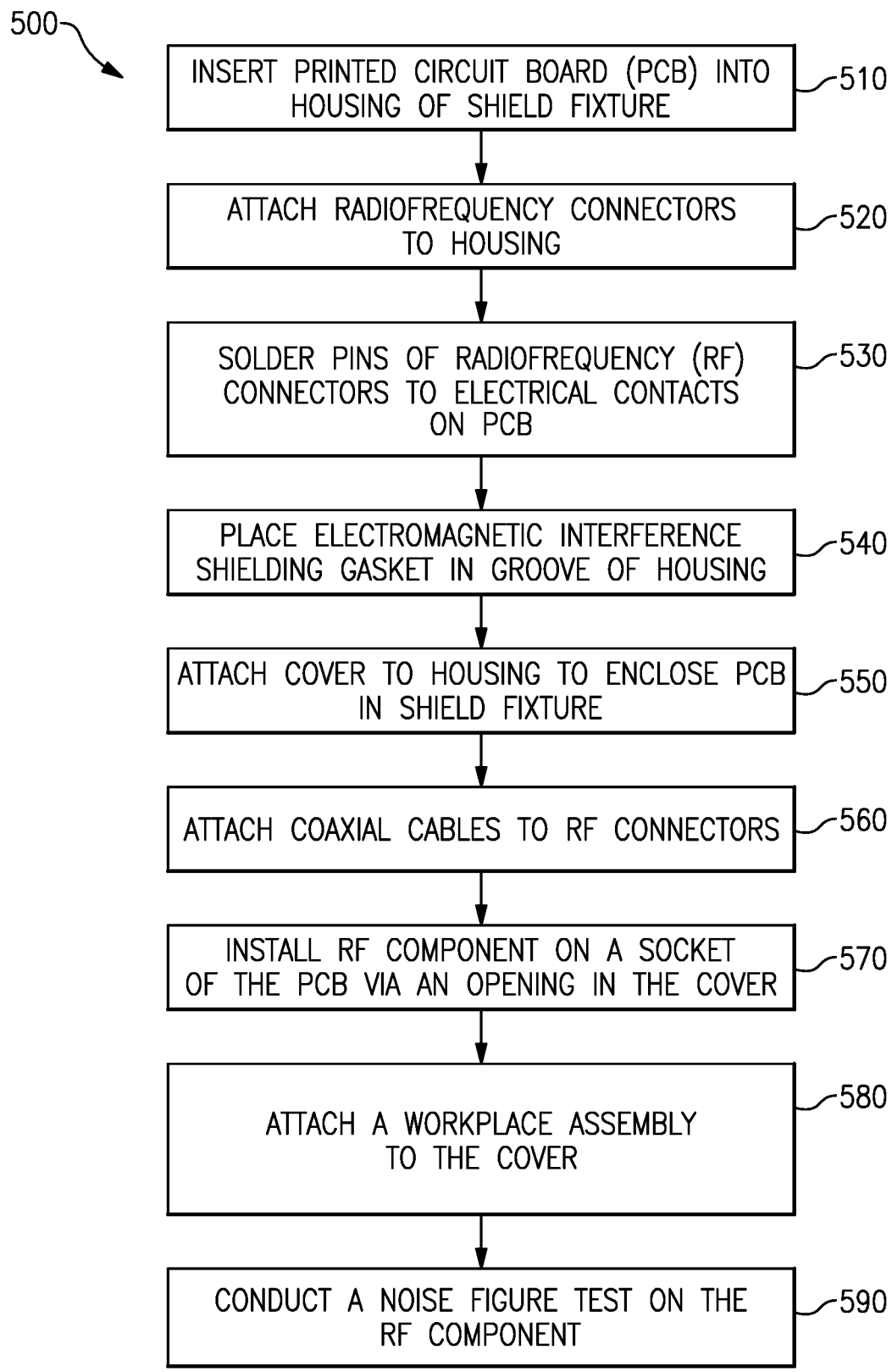
FIG. 10 is a block diagram of a method for installing a printed circuit board in an enclosure module for a test procedure.

FIG. 10 illustrates an example process 500 for installing a printed circuit board, such as the PCB 300, in a shielded enclosure module, such as shield enclosure 200, for a test procedure. At block 510, the PCB 300 is inserted through the opening 220 in the housing 210 so that the PCB 300 rests on one or both of the inner lower rim 222 and the gasket 226. At block 520, one or more RF connector(s) 24 are attached to the walls 214, 216 so that pins 24A of the RF connector(s) 24 extend through the hole(s) 22A so that they align with electrical contacts 305 (e.g., traces) on the PCB 300. At block 530, the pins 24A of the RF connector(s) 24 are soldered to the electrical contacts 305. At block 540, the gasket 232 is inserted into the groove 230 if it has not previously been inserted therein. At block 550, the cover 250 is coupled to the housing 210 so that the cover 250 contacts one or both of the upper rim 228 and the gasket 232. At block 560, one or more coaxial cables (not shown) are coupled to the RF connector(s) 24. At block 570, a part (e.g., RF component) is installed on the socket 310 of the PCB 300. At block 580, the workplace assembly 400 is coupled to the cover 250 to completely seal the shield enclosure 200. At block 590, a noise figure test is conducted on the part (e.g., RF component).

Figure 11:
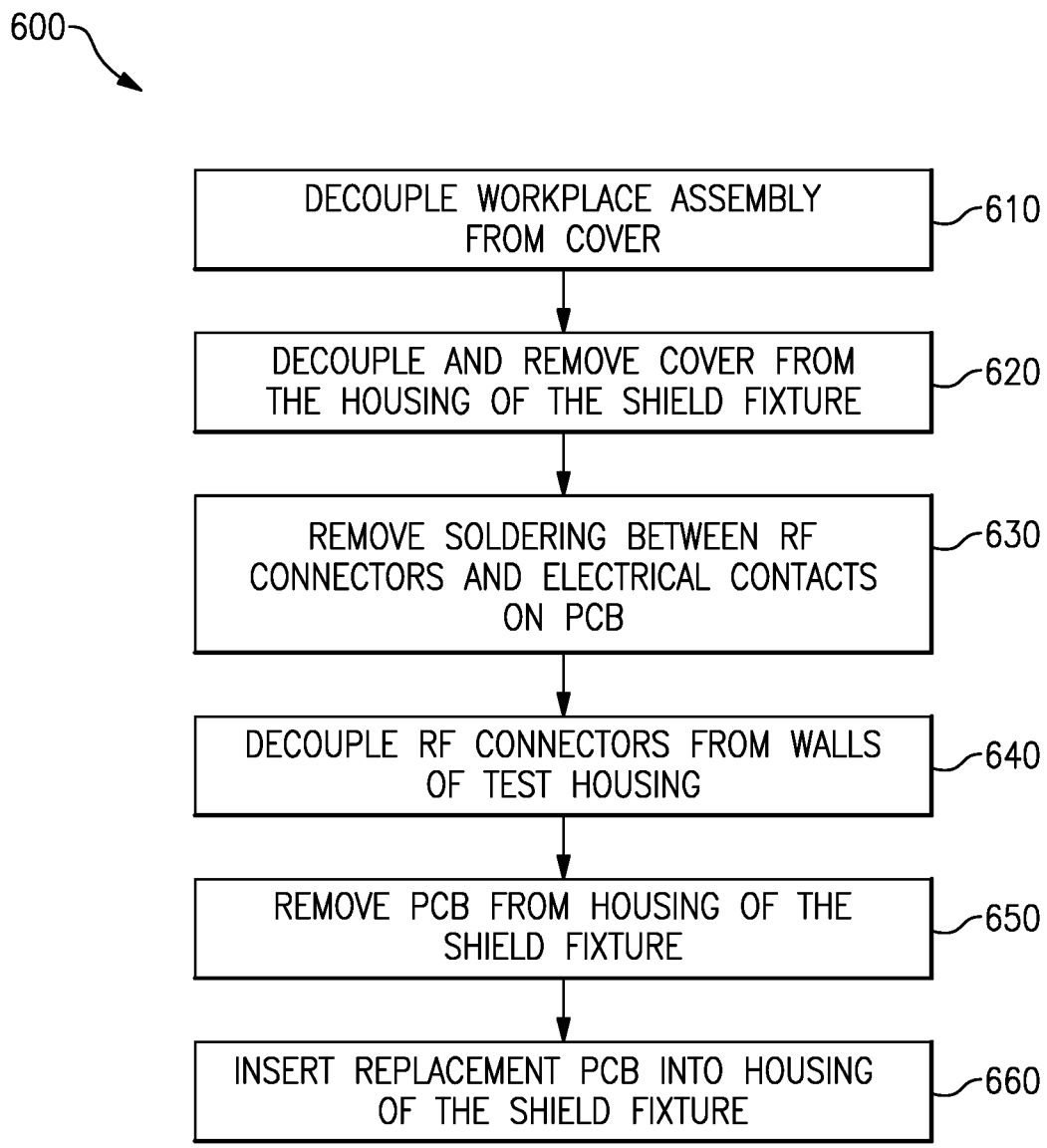
FIG. 11 is a block diagram of a method for replacing a printed circuit board in an enclosure module.

FIG. 11 illustrates an example process 600 for replacing a printed circuit board, such as the PCB 300, in a shielded enclosure module, such as shield enclosure 200, prior to a test procedure. At block 610, the workplace assembly 400 is decoupled from the cover 250. At block 620, the cover 250 is decoupled from the housing 210 and removed. At block 630, the soldering between the RF connector(s) 24 and the electrical contact(s) 305 is removed. At block 640, the RF connector(s) 24 are decoupled from the walls 214, 216 of the housing 210. At block 650, the PCB 300 is removed from the housing 210. At block 660, a replacement PCB 300 is inserted through the opening 220 in the housing 210 so that the PCB 300 rests on one or both of the inner lower rim 222 and the gasket 226. Optionally, the gasket 226 can be replaced prior to inserting the replacement PCB 300. Thereafter, the steps 520-590 of method 500 can be repeated. For example, one or more RF connector(s) 24 are attached to the walls 214, 216 so that pins 24A of the RF connector(s) 24 extend through the hole(s) 22A and so that they align with electrical contacts 305 (e.g., traces) on the PCB 300. The pins 24A of the RF connector(s) 24 can be soldered to the electrical contacts 305 of the PCB 300. The gasket 232 can be inserted into the groove 230 if it has not previously been inserted therein or is optionally replaced. The cover 250 is coupled to the housing 210 so that the cover 250 contacts one or both of the upper rim 228 and the gasket 232. One or more coaxial cables (not shown) can be coupled to the RF connector(s) 24. A part (e.g., RF component) can be installed on the socket 310 of the PCB 300. The workplace assembly 400 can be coupled to the cover 250 to completely seal the shield enclosure 200. At block 740, a noise figure test is conducted on the part (e.g., RF component).

Advantageously, the shield enclosure 200 reduces radiofrequency interference, such as radiofrequency signals absorbed by the printed circuit board 300 (and/or radiofrequency component mounted thereon), by at least 40 dB during testing (e.g., during noise figure testing). Accordingly, testing of the printed circuit board 300 (and/or radiofrequency component mounted thereon), such as noise figure testing, can be conducted while inhibiting (e.g., preventing) inaccurate measurement, allowing for an increased test yield of radiofrequency components.

Figure 12A:
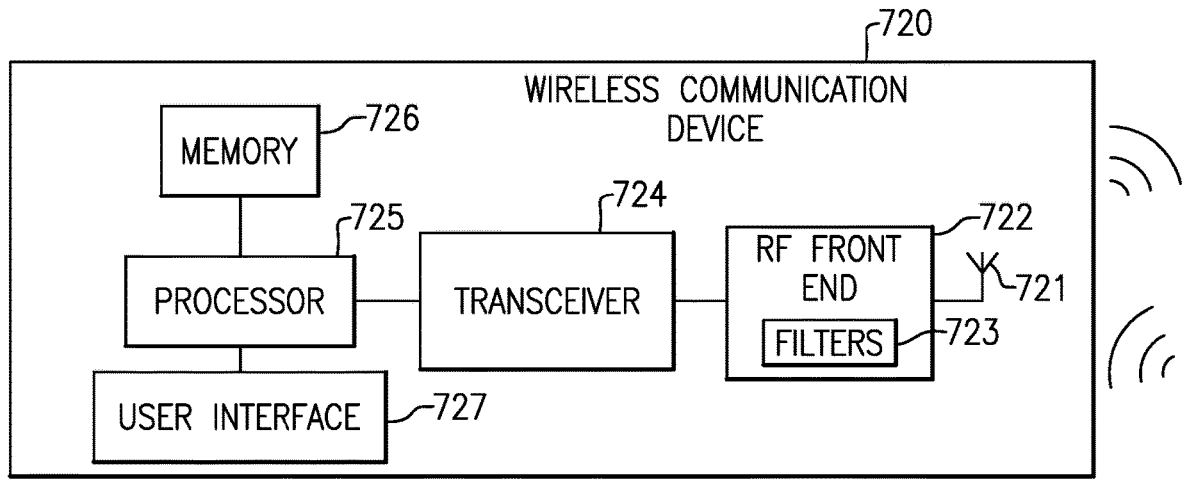
FIG. 12A is a schematic block diagram of a wireless communication device in accordance with one or more embodiments.

FIG. 12A is a schematic diagram of a wireless communication device 720 that includes filters 723 in a radio frequency front end 722 according to an embodiment. The filters 723 can include one or more SAW resonators. The wireless communication device 720 can be any suitable wireless communication device. For instance, a wireless communication device 720 can be a mobile phone, such as a smart phone. As illustrated, the wireless communication device 720 includes an antenna 721, an RF front end 722, a transceiver 724, a processor 725, a memory 726, and a user interface 727. One or more of these components can be disposed (e.g., mounted) on a PCB, such as a PCB tested using the system and method disclosed herein. The antenna 721 can transmit/receive RF signals provided by the RF front end 722. Such RF signals can include carrier aggregation signals. Although not illustrated, the wireless communication device 720 can include a microphone and a speaker in certain applications.

The RF front end 722 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 722 can transmit and receive RF signals associated with any suitable communication standards. The filters 723 can include SAW resonators of a SAW component that includes any suitable combination of features discussed with reference to any embodiments discussed above.

The transceiver 724 can provide RF signals to the RF front end 722 for amplification and/or other processing. The transceiver 724 can also process an RF signal provided by a low noise amplifier of the RF front end 722. The transceiver 724 is in communication with the processor 725. The processor 725 can be a baseband processor. The processor 725 can provide any suitable base band processing functions for the wireless communication device 720. The memory 726 can be accessed by the processor 725. The memory 726 can store any suitable data for the wireless communication device 720. The user interface 727 can be any suitable user interface, such as a display with touch screen capabilities.

Figure 12B:
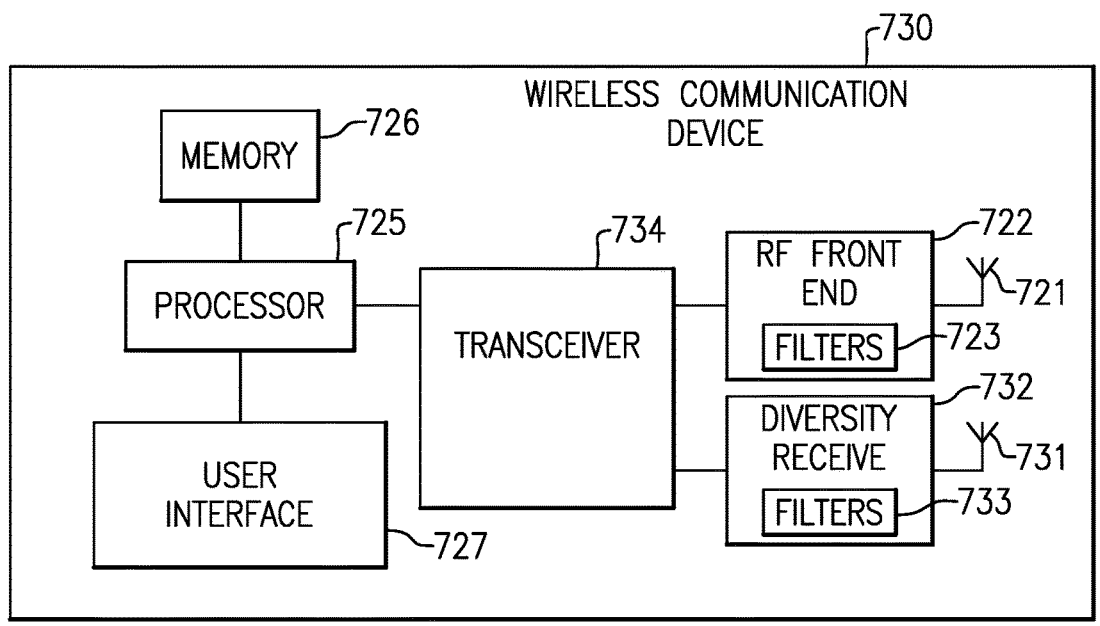
FIG. 12B is a schematic block diagram of another wireless communication device in accordance with one or more embodiments.

FIG. 12B is a schematic diagram of a wireless communication device 730 that includes filters 723 in a radio frequency front end 722 and a second filter 733 in a diversity receive module 732. One or more of these components can be disposed (e.g., mounted) on a PCB, such as a PCB tested using the system and method disclosed herein. The wireless communication device 730 is like the wireless communication device 720 of FIG. 12A, except that the wireless communication device 730 also includes diversity receive features. As illustrated in FIG. 12B, the wireless communication device 730 includes a diversity antenna 731, a diversity module 732 configured to process signals received by the diversity antenna 731 and including filters 733, and a transceiver 734 in communication with both the radio frequency front end 722 and the diversity receive module 732. The filters 733 can include one or more SAW resonators that include any suitable combination of features discussed with reference to any embodiments discussed above.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. For example, one portion of one of the embodiments described herein can be substituted for another portion in another embodiment described herein. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A method for shielding a printed circuit board from electromagnetic interference and noise during noise figure testing, comprising:

inserting a printed circuit board with at least one radiofrequency component mounted thereon through an opening in a cover of a cavity of a housing, the cavity defined by a peripheral wall of the housing;

attaching one or more radiofrequency connectors to the peripheral wall so that a pin of each radiofrequency connectors substantially aligns with an electrical contact on the printed circuit board;

soldering the pin of the one or more radiofrequency connectors to its corresponding electrical contact on the printed circuit board; and sealing the opening in the cover of the housing with a tool to at least partially seal the cavity.

2. The method of claim 1 wherein the housing has a generally rectangular shape.

3. The method of claim 1 wherein the peripheral wall is defined by a first pair of spaced a part walls that are generally perpendicular to a second pair of spaced apart walls.

4. The method of claim 1 wherein inserting the printed circuit board into the cavity includes inserting printed circuit board so that it is disposed over an inner lower shoulder of the housing.

5. The method of claim 4 further comprising at least partially inserting a gasket into a groove defined in the inner lower shoulder prior to inserting the printed circuit board into the cavity.

6. The method of claim 5 wherein the gasket comprises an electromagnetic isolator elastomer.

7. The method of claim 1 further comprising at least partially inserting a gasket into a groove on a rim of the peripheral wall prior to at least partially sealing the cover to the housing.

8. The method of claim 7 wherein the gasket comprises an electromagnetic isolator elastomer.

9. The method of claim 1 wherein attaching the one or more radiofrequency connectors comprises mounting one or more flange mount SubMiniature version A connectors to the housing so that a flange of the one or more connectors couples to an outer surface of the peripheral wall and so that the pin of the one or more connectors extends through an opening in the peripheral wall that generally aligns with the electrical contact of the printed circuit board.

10. The method of claim 1 further comprising inserting a tool through the opening in the cover to thereby seal the printed circuit board and radiofrequency component in the cavity.

* * * * *